United States Patent [19]
McAllister

[11] Patent Number: 5,804,308
[45] Date of Patent: Sep. 8, 1998

[54] HEAT LAG MEDIA

[76] Inventor: Richard C. McAllister, Old Princeton Rd., Fitchburg, Mass. 01420

[21] Appl. No.: 511,598

[22] Filed: Aug. 4, 1995

[51] Int. Cl.$^6$ ............................................. D02G 3/00
[52] U.S. Cl. ........................ 428/375; 428/297.4; 428/393; 428/394; 428/396; 428/532; 428/535; 428/537.1; 428/537.5
[58] Field of Search ............................ 428/393, 394, 428/532, 535, 537.1, 537.5, 297.4, 375, 396

[56] References Cited

U.S. PATENT DOCUMENTS

| | | | |
|---|---|---|---|
| 4,353,981 | 10/1982 | Noda | 430/536 |
| 4,487,657 | 12/1984 | Gomez | 162/158 |
| 5,075,206 | 12/1991 | Noda | 430/531 |
| 5,106,818 | 4/1992 | Ashida | 503/227 |
| 5,106,989 | 4/1992 | Kubbota | 548/220 |
| 5,182,161 | 1/1993 | Noda | 428/195 |
| 5,213,888 | 5/1993 | Kubbota | 428/328 |
| 5,264,033 | 11/1993 | Noda | 106/447 |
| 5,326,624 | 7/1994 | Tsubaki | 428/213 |
| 5,464,732 | 11/1995 | Kida | 430/505 |
| 5,547,822 | 8/1996 | Noda | 430/947 |

*Primary Examiner*—Leszek Kiliman
*Attorney, Agent, or Firm*—Burns, Doane, Swecker and Mathis

[57] ABSTRACT

Provided is a cellulosic substrate which is impregnated with a polymeric binder, preferably a latex, and a metal containing fatty acid compound. The cellulosic substrate is excellently suited as cushion stock to be used as heat lag media in the manufacturing of circuit boards since it provides excellent heat dispersion and release properties.

21 Claims, No Drawings

HEAT LAG MEDIA

BACKGROUND OF THE INVENTION

The present invention relates to a novel cellulosic substrate which is particularly useful as cushion stock in the preparation of circuit boards. The cushion stock is comprised of a single layer substrate. The present invention also relates to a method for making such cushion stock and to a method preparing circuit boards using the cushion stock as heat lag media.

Cushion stock is well known to be used as heat lag material in the preparation of circuit boards. Circuit boards are prepared by pressing various layers of copper foil and other materials under heat and pressure. The heat lag material is used to primarily give a constant heating/cooling rate and profile across the entire structure being pressed. One of the deficiencies in current cushion stock used as heat lag media is that after exposure to high pressure and temperature, some of the media is deposited or remains on the forming surfaces, which residual deposits must be thoroughly removed to avoid damaging the board in the next pressing via downstream contamination.

Due to this problem, various multiple layered cushion stocks have been suggested. For example, the cushion stock, which is generally comprised of a low density, very well formed cellulosic board, is laminated to a polyvinyl fluoride film. While this bilayer system is effective in avoiding the unwanted residual deposits, it is also a very high priced medium. Other dual layer systems have been suggested, such as lamination of a kraft board containing silicon as a release layer to typical cushion stock. But these dual layer systems have not been nearly as effective and are also uneconomical.

Accordingly, there is a need for a simple and economical cushion stock which can be effectively used as heat lag media in making circuit boards. The cushion stock must overcome the problems of unwanted deposits and therefore must release easily even after the high temperatures and pressures used during the pressing of the circuit boards. Providing such a cushion stock would be of great benefit to the industry.

An object of the present invention is therefore to provide a novel cellulosic substrate which can be used as heat lag media in the making of circuit boards.

Another object of the present invention is to provide a method for making such a cellulosic substrate.

Yet another object of the present invention is to provide a novel method for making circuit boards involving such heat lag media.

These and other objects of the present invention will become apparent upon a review of the following specification and the claims appended thereto.

SUMMARY OF THE INVENTION

Provided is a cellulosic substrate impregnated with a polymeric binder, preferably a polymeric latex, and a metal containing fatty acid compound. Preferably, the fatty acid compound contains aluminum as the metal, and most preferably a mixture of fatty acid compounds of different stabilized metals, including aluminum. Aluminum, however, is most preferred. The other metals can include zinc, titanium and zirconium. Such a cellulosic substrate has been found extremely useful as heat lag media in the preparation of circuit boards.

In another embodiment, there is provided a method for making the cellulosic substrate of the present invention. The cellulosic substrate can be easily prepared by employing traditional papermaking techniques. The wood pulp or cellulosic pulp is first dispersed in an aqueous medium, to which is added the polymeric binder. If the binder is a latex, the latex particles are then precipitated using a suitable compound such as alum. The metal containing fatty acid compound is then added to the mix, with the aqueous mix being passed onto a moving wire screen typical of papermaking machines in order to remove the liquid portion of the mix. The resulting substrate is then dried to form the cellulosic substrate.

In still another embodiment, a cellulosic substrate is used as heat lag media in the preparation of circuit boards. The heat lag media is employed in order to provide a constant heating/cooling rate and profile across the entire structure being pressed. The cellulosic substrate employed generally has a sheet bulk of about 15–40 lbs./cu. ft., more preferably from 15–25 lbs./cu. ft., and most preferably about 20 lbs./cu. ft., when being employed as heat lag media.

Generally, the present invention is based, among other factors, on the recognition that using the polymeric binder, preferably a latex, together with the metal containing fatty acid compound provides excellent web integrity and release properties to the cellulosic substrate. The two components together impregnated in the cellulosic substrate prevent unwanted deposits of cellulosic fibers on the forming surfaces used in the preparation of circuit boards, and also avoid unwanted sticking of the heat lag media to the forming surfaces. Polymeric binders can become liquids at the pressing temperatures employed in the preparation of circuit boards, and therefore will undergo flow and migrate toward the hot surface and cause sticking to the plate after cooling. Surprisingly, however, when the metal containing fatty acid compound is used in conjunction with the binder, the sticking problem is overcome exceptionally well.

DETAILED DESCRIPTION OF THE PREFERRED EMBODIMENTS

The substrate of the present invention which can be used as heat lag media quite successfully in the preparation of circuit boards comprises a cellulosic substrate impregnated throughout its structure with a polymeric latex and a metal containing fatty acid compound. The cellulosic substrate is preferably comprised of a wood pulp, with any suitable wood pulp being acceptable. It is preferred, however, that a mixture of hardwood and softwood be used when the substrate is destined for use as heat lag media. Examples of suitable hardwood pulp include gum, maple and eucalyptus pulp. Examples of suitable softwood pulp include pine, spruce and hemlock. If desired, the cellulosic substrate can also contain a minor portion of synthetic fibers.

When the cellulosic substrate is to be employed as heat lag media in the preparation of circuit boards, the substrate as cushion stock is generally a low density product. Employing papermaking techniques, the density can be controlled such that its bulk is measured preferably in the range of from about 15–40 lbs./cu. ft., more preferably in the range of from about 15–25 lbs./cu. ft., and most preferably about 20 lbs./cu. ft.

The amount of cellulosic substrate employed is preferably in the range of from about 85–95 wt. % of the structure, more preferably in the range of about 88–92 wt. %, and most preferably about 90 wt. %. The polymeric binder, with the latex being on a dry basis, is preferably employed in the amount of from about 8–12 wt. % of the structure, and most preferably about 10 wt. %. The metal containing fatty acid compound is preferably employed in an amount which ranges from about 0.5–5 wt. % on dry basis of the compound, and based upon the dry weight of the cellulosic pulp and latex, more preferably in the range of from about 1–3 wt. %. and most preferably in the range of from about 1–1.5 wt. %. The latter wt. % of fatty acid compound is most preferred due to economical reasons, as it balances excellent results with the economy of the substrate.

The binder used to impregnate the cellulosic substrate can generally be any polymeric binder, but is most preferably a latex, such as an acrylic binder latex, styrene butadiene latex, or a nitrile latex binder. Polyvinyl alcohol binder can also be used. Of the foregoing, the acrylic latex binders have been found to work quite excellently, and are most preferred.

The metal containing fatty acid compound preferably contains aluminum as the metal. Other metals which are preferred include zinc, titanium and zirconium. It is most preferred that a mixture of fatty acid compounds containing different metals be used. A mixture of fatty acid compounds containing aluminum and fatty acid compounds containing zinc is the mixture most preferred. The fatty acid portion of the compound preferably contains from 12 to 18 carbons.

Such metal containing fatty acid compounds are commercially available and are sold, for example, by Chartwell International, Inc. of Sharon, Massachusetts, as adhesion promoters. The most preferred metal containing fatty acid compounds for use are those sold under the Chartwell designation B-535.1. The compounds are of the general formula

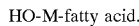

HO-M-fatty acid.

The M represents the metal, which is stabilized in the compound, and can be aluminum, zinc, titanium, zirconium or other suitable metals. It is most preferred, however, that aluminum compounds comprise at least a portion of the metal containing fatty acid compounds used. The fatty acid functional portion of the compound preferably contains from 12 to 18 carbon atoms, however other fatty acids can be used. As well, while fatty acids are the most preferred functional portion of the metal containing compound, other carboxy functionalities can be employed, although they are less preferred.

In the making of the cellulosic substrate, conventional papermaking techniques can be made. This is one of the advantages of the present invention in that the cushion stock comprises a single layer cellulosic substrate which can be made simply and economically using conventional papermaking techniques. The cellulosic pulp is generally dispersed in water or other suitable medium, with the polymeric binder then being added to the pulp. When a latex is used, once the polymeric latex has been added, the polymer is precipitated using a suitable agent, such as alum. Sufficient alum is used to generally render the pH of the solution to about 3.0 to 4.5. It is important that the latex be destabilized in order to precipitate the polymer particles so that the latex can act as a binder for the pulp fibers.

The metal containing fatty acid compound is then also added to the mixture in an amount suitable to provide the requisite function of interacting with the latex polymer to give good release properties to the cellulosic substrate. These release properties are realized even under the high pressures and temperatures (e.g., 375° F.) used in the preparation of circuit boards.

When a cushion stock to be used as heat lag media in the preparation of circuit boards is to be prepared, the wood pulp and manner of making it is chosen in order to provide a low density cellulosic substrate. Preferably, the wood pulp employed is a combination of hardwood and softwood. The bulk of the final product, including the binder and metal containing fatty acid compound, is preferably in the range of from 15–40 lbs./cu. ft., and more preferably about 20 lbs./cu. ft.

The cellulosic substrate can be used for making both rigid and flexible circuit boards. It can be used as a release liner for heat lag media whenever composite manufacturing is to occur. Basically, the cellulosic substrate is an excellent heat insulation sheet and can be used wherever heat insulation sheets are needed, and where it is important that the sheet has good release properties so that it does not stick.

In general, the cellulosic substrate of the present invention provides one with a cushion stock useful as heat lag media that has many advantages over that of the prior art. One of the advantages is that it is a single layer as opposed to many of the dual layers of the prior art. The performance of the single layer cellulosic substrate of the present invention employing the combination of the polymer binder and the metal containing fatty acid compound release agent is quite excellent at economic levels of both the binder and the release agent. The ease with which the cellulosic substrate is made also enhances its commercial value since conventional papermaking techniques can be used.

The invention will now be illustrated in greater detail by the following specific example. It is understood that these examples are given by way of illustration and are not meant to limit the disclosure of the claims to follow. All percentages in the examples and elsewhere in the specification are by dry basis (of the active ingredient) weight unless other specified.

EXAMPLE

A number of hand sheets were made involving a wood pulp which is approximately a 50/50 mix of hardwood/softwood. An acrylic latex available under the designation V-43 from B. F. Goodrich was used in each instance. The latex is a highly crosslinked acrylic latex. The latex was added to the aqueous wood pulp mix and destabilized by the addition of alum. Also added to the mix was a release agent, one of four different release agents. Once mixed, the hand sheet was formed and the final sheet tested for basis weight, caliper, bulk and its sticking factor. The sticking factor was determined based upon how the sheet stuck to aluminum foil after pressing a 4"×4' piece at 1500 psi at 375° F. for 5 minutes. The rating ranged from 1+which was best, i.e., a clean release, to 5 which indicated severe sticking. In the rating system, 1+ was the best, with 1 being slightly less in the rating, 1− being slightly less than 1, 2+ being slightly less than 1−, 2 being slightly less than 2+ and so forth.

The results of the various runs are provided in the table below. The table sets forth the various amounts of the wood pulp and acrylic latex provided in each sample. The amount of release agent used is a percentage based on the dry weight of the release agent (since the agent may come diluted in a solvent/solution), which percentage is based upon the total amount of wood pulp and acrylic latex employed.

TABLE

| | SAMPLE NO. | | | | | | | | | | |
|---|---|---|---|---|---|---|---|---|---|---|---|
| | 1 | 2 | 3 | 4 | 5 | 6 | 7 | 8 | 9 | 10 | 11 |
| Wood Pulp | 90% | 100% | 90% | 90% | 90% | 90% | 95% | 90% | 90% | 80% | 80% |
| Acrylic Latex | 10% | | 10% | 10% | 10% | 10% | 5% | 10% | 10% | 20% | 20% |
| Release Agents- | | | | | | | | | | | |
| Talc | | 5% | | | | | | | | | |
| Chartwell B525.1 | 5% | | 3% | | | | | | | | |
| Chartwell B535.1 | | | | 3% | | 1% | 1% | | | | |
| Silicone Spray | | | | | | | | 2% | 5% | 2% | 5% |
| Basis Wt. | 295 | 315 | 275 | 280 | 271 | 277 | 282 | 281 | 295 | 287 | 334 |
| Caliper | 65 | 66 | 65 | 64 | 60 | 61 | 59 | 55 | 64 | 54 | 55 |
| lbs./pt. (Bulk) | 4.54 | 4.79 | 4.25 | 4.37 | 4.53 | 4.52 | 4.75 | 5.15 | 4.64 | 5.35 | 6.11 |
| Rating (Sticking Factor) | 2 | 2 | 2− | 1+ | 4–5 | 2+ | 2− | 2 | 2 | 3 | 1 |

From the foregoing table, it can be seen that the Chartwell B535.1 agent, which is an aluminum containing fatty acid compound in mixture with a zinc containing fatty acid compound of the structure previously mentioned, gave by far the best performance. At only 1% agent (on a dry basis weight), the performance was better than any of the other release agents at even 5%. When 3% of the metal containing fatty acid compound was used in the cellulosic substrate, a clean release or a 1+ rating for the sticking factor was observed. Economics may dictate using less than 3%, for example between 1 and 3%. However, it is clear that the metal containing fatty acid compounds provide excellent performance in combination with the acrylic latex binder under conditions similar to that employed in the manufacture of circuit boards.

While the invention has been described with preferred embodiments, it is to be understood that variations and modifications may be resorted to as will be apparent to those skilled in the art. Such variations and modifications are to be considered within the purview and the scope of the claims appended hereto.

What is claimed:

1. A cellulosic substrate impregnated with a polymeric binder and from 0.5 to 5 wt. %, based upon the total weight of the pulp and binder, of a metal containing fatty acid compound of the formula HO-M-fatty acid where M represents a metal and-fatty acid represents the fatty acid portion of the compound.

2. The cellulosic substrate of claim 1, wherein the cellulosic substrate comprises from 85–95 wt. % cellulosic pulp, and from 8–12 wt. % binder.

3. The cellulosic substrate of claim 1, wherein the cellulosic substrate comprises from 88–92 wt. % cellulosic pulp, from 8–12 wt. % polymeric binder, and from 1–3 wt. % metal containing fatty acid compound based upon the weight of the pulp and binder.

4. The cellulosic substrate of claim 1, wherein the cellulosic substrate comprises from about 90 wt. % cellulosic pulp, about 10 wt. % polymeric binder, and from 1 to about 1.5 wt. % metal containing fatty acid compound based upon the weight of the pulp and binder.

5. The cellulosic substrate of claim 1, wherein the cellulosic portion comprises a combination of hardwood and softwood pulp.

6. The cellulosic substrate of claim 1, wherein the polymeric binder is an acrylic polymer latex, styrene butadiene polymeric latex, a nitrile polymeric latex or a polyvinyl alcohol binder.

7. The cellulosic substrate of claim 6, wherein the polymeric binder comprises an acrylic polymer latex.

8. The cellulosic substrate of claim 1, wherein the metal containing fatty acid compound is comprised of an aluminum, zinc, titanium or zirconium containing compound, or a mixture of such metal containing compounds.

9. The cellulosic substrate of claim 8, wherein the mixture of metal containing fatty acid compounds is employed.

10. The cellulosic substrate of claim 9, wherein the mixture of fatty acid compounds comprises aluminum containing fatty acid compounds and zinc containing fatty acid compounds.

11. The cellulosic substrate of claim 1, wherein the fatty acid portion of the metal containing fatty acid compound contains from 12 to 18 carbon atoms.

12. The cellulosic substrate of claim 1, wherein the polymeric binder comprises an acrylic latex, the metal containing fatty acid compound comprises an aluminum containing fatty acid compound containing from 12 to 18 carbon atoms in the fatty acid portion of the compound, and the amount of cellulosic pulp in the cellulosic substrate ranges from 88–92 wt. %, the amount of polymeric latex on a dry weight basis ranges from 8–12 wt. % and the amount of metal containing fatty acid compound ranges from 1–3 wt. % based upon the weight of the pulp and latex.

13. A method of making the cellulosic substrate of claim 1, which comprises the following steps:

dispersing cellulosic pulp in an aqueous medium, adding a polymeric latex to the pulp dispersion and then precipitating the polymer particles from the latex using a precipitation agent, adding a metal containing fatty acid compound to the dispersion with the compound having the formula HO-M-fatty acid, where M represents a metal and-fatty acid represents the fatty acid portion of the compound, and forming a paper product from the aqueous dispersion containing the cellulosic pulp, polymeric latex and metal containing fatty acid compound.

14. The process of claim 13, wherein the precipitation agent is alum and the pH to which the dispersion is adjusted is in the range of from about 3.0 to 4.5.

15. The method of claim 13, wherein the polymeric latex is an acrylic latex.

16. The method of claim 13, wherein the metal containing fatty acid compound comprises an aluminum containing fatty acid compound.

17. The method of claim 13, wherein the metal containing fatty acid compound comprises a mixture of metal containing fatty acid compounds selected from the group consisting of aluminum containing fatty acid compounds, zinc containing fatty acid compounds, titanium containing fatty acid compounds and zirconium containing fatty acid compounds.

18. A method of making a circuit board involving the pressing of layers of copper film under heat and pressure and the use of heat lag media being employed to ensure even heat distribution across the layers of copper film, the method comprising employing the cellulosic substrate of claim 1 as the heat lag media.

19. The method of claim 18, wherein the heat lag media is comprised of a cellulosic substrate which comprises from 88–92 wt. % cellulosic pulp, 8–12 wt. % polymeric binder and from 1–3 wt. % of a metal containing fatty acid compound, based upon the weight of the cellulosic pulp and binder.

20. A cushion stock for circuit boards, where the cushion stock comprises a single layer cellulosic substrate impregnated with a polymeric binder and from 0.5 to 5 weight percent, based upon the total weight of the pulp and binder in the cellulosic substrate, of a metal containing fatty acid compound of the formula HO-M-fatty acid where M represents a metal and-fatty acid represents the fatty acid portion of the compound, and where the cushion stock exhibits a bulk in the range of from about 15 lbs./cu. ft. to about 40 lbs./cu. ft.

21. The cushion stock of claim 20, wherein the bulk is in the range of from about 15 to 25 lbs./cu. ft.

* * * * *